(12) United States Patent
Ito et al.

(10) Patent No.: US 11,715,522 B2
(45) Date of Patent: Aug. 1, 2023

(54) SEMICONDUCTOR DEVICE EQUIPPED WITH COLUMN DECODER CIRCUIT

(71) Applicant: MICRON TECHNOLOGY, INC., Boise, ID (US)

(72) Inventors: Akeno Ito, Yokohama (JP); Takayori Hamada, Sagamihara (JP); Mamoru Nishizaki, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 99 days.

(21) Appl. No.: 17/359,268

(22) Filed: Jun. 25, 2021

(65) Prior Publication Data

US 2022/0415397 A1 Dec. 29, 2022

(51) Int. Cl.
*G11C 16/08* (2006.01)
*G11C 16/30* (2006.01)
*H10B 12/00* (2023.01)

(52) U.S. Cl.
CPC .............. *G11C 16/08* (2013.01); *G11C 16/30* (2013.01); *H10B 12/50* (2023.02)

(58) Field of Classification Search
CPC .... G11C 16/08; G11C 16/30; H01L 27/10897
See application file for complete search history.

(56) References Cited

U.S. PATENT DOCUMENTS

| | | | |
|---|---|---|---|
| 2012/0236669 A1* | 9/2012 | Yamagami | H01L 29/94 365/207 |
| 2020/0126622 A1* | 4/2020 | Utsumi | H10B 43/40 |
| 2021/0065802 A1* | 3/2021 | Rabkin | G11C 29/028 |

* cited by examiner

*Primary Examiner* — John W Poos
*Assistant Examiner* — Tyler J Pereny
(74) *Attorney, Agent, or Firm* — Dorsey & Whitney LLP

(57) ABSTRACT

Disclosed herein is an apparatus that includes a driver circuit including a plurality of first transistors arranged in a first direction; a control circuit including a plurality of second transistors arranged in parallel to the plurality of first transistors, each of the plurality of second transistors being coupled to control an associated one of the first transistors; and a power gating circuit arranged between the driver circuit and the control circuit, the power gating circuit being configured to supply a first power potential to each of the plurality of first transistors.

19 Claims, 10 Drawing Sheets

SEMICONDUCTOR DEVICE EQUIPPED WITH COLUMN DECODER CIRCUIT

BACKGROUND

A semiconductor memory device such as a DRAM is equipped with a column decoder for selecting a column. The column decoder includes a plurality of driver circuits, a control circuit that selects any of the driver circuits based on a column address, and a power supply circuit that supplies a power-supply voltage to the driver circuits. Such a semiconductor memory device has a problem of laying out the driver circuits, the control circuit, and the power supply circuit in a limited space. In particular, in a case of arranging a compensation capacitance above the driver circuits, it is impossible to arrange low-resistance power-supply wiring above the driver circuits, and thus power-supply wiring that detours around the compensation capacitance is required. In this case, an area on which the power-supply wiring detouring around the compensation capacitance overlaps becomes a blank area where no transistor is arranged, resulting in an increase in the chip area.

DETAILED DESCRIPTION

Various embodiments of the present invention will be explained below in detail with reference to the accompanying drawings. The following detailed description refers to the accompanying drawings that show, by way of illustration, specific aspects, and embodiments in which the present invention may be practiced. These embodiments are described in sufficient detail to enable those skilled in the art to practice the present invention. Other embodiments may be utilized, and structural, logical, and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
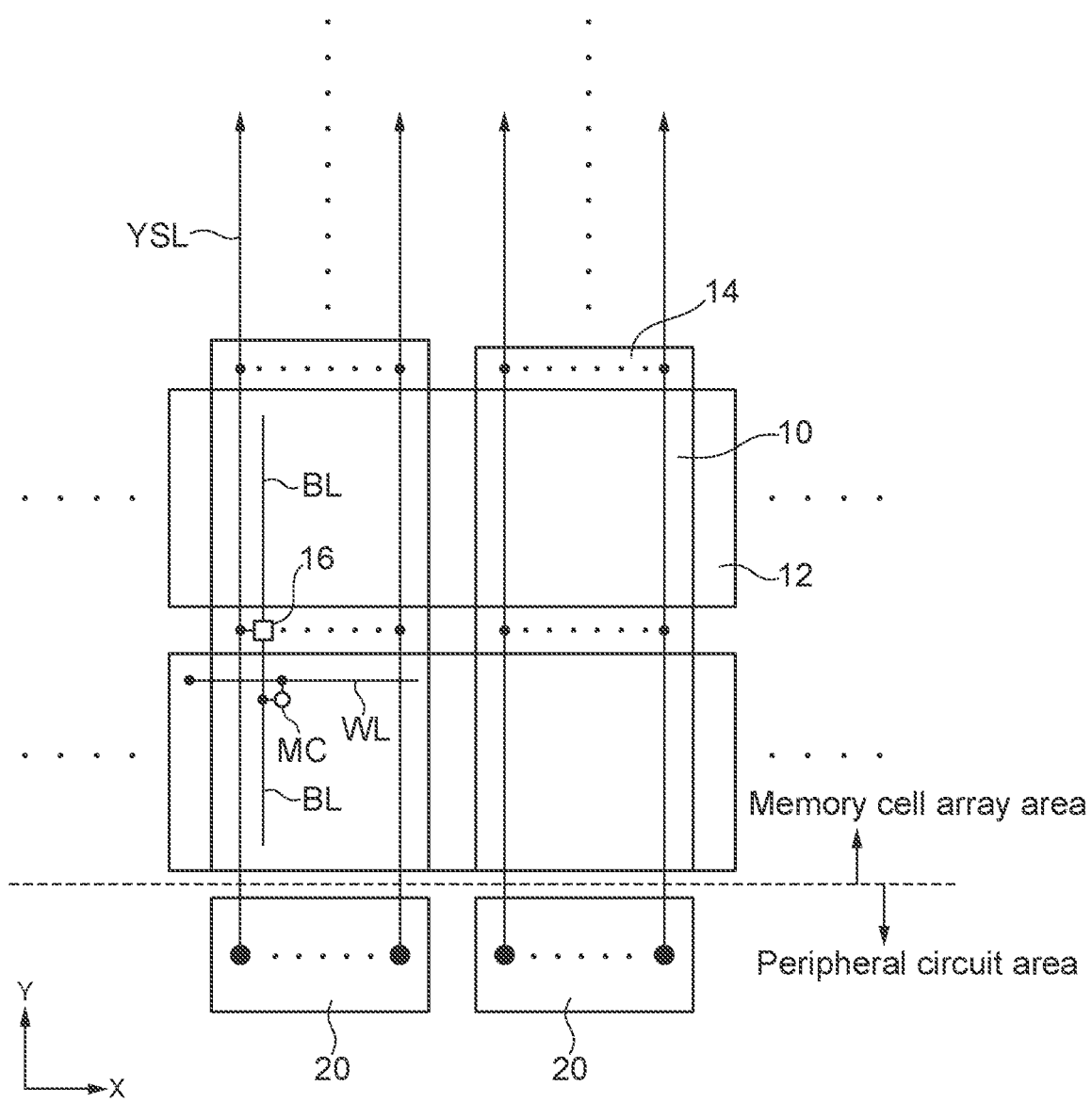
FIG. 1 is a schematic diagram showing a configuration of a main portion of a semiconductor memory device according to an embodiment of the present disclosure.

FIG. 1 is a schematic diagram showing a configuration of a main portion of a semiconductor memory device according to an embodiment of the present disclosure. The semiconductor memory device according to the present disclosure is, for example, a DRAM and includes a memory cell array area and a peripheral circuit area as shown in FIG. 1. In the memory cell array area, a plurality of memory mats 10 are arranged in a matrix. A sub word driver area 12 is arranged between the memory mats 10 adjacent to each other in an X direction. In the sub word driver area 12, a plurality of sub word drivers are arranged in a Y direction, and any one of word lines WL is selected based on a row address. A sense amplifier area 14 is arranged between the memory mats 10 adjacent to each other in the Y direction. In the sense amplifier area 14, a plurality of sense amplifiers 16 are arranged in the X direction, and any one of the sense amplifiers 16 is selected based on a column address. To each sense amplifier 16, a pair of bit lines BL corresponding thereto are coupled. Accordingly, any of memory cells MC can be selected by a row address and a column address. Selection of the sense amplifiers 16 is performed with a plurality of column selection lines YSL extending in the Y direction. The column selection lines YSL are driven by column decoders 20 arranged in the peripheral circuit area.

Figure 2:
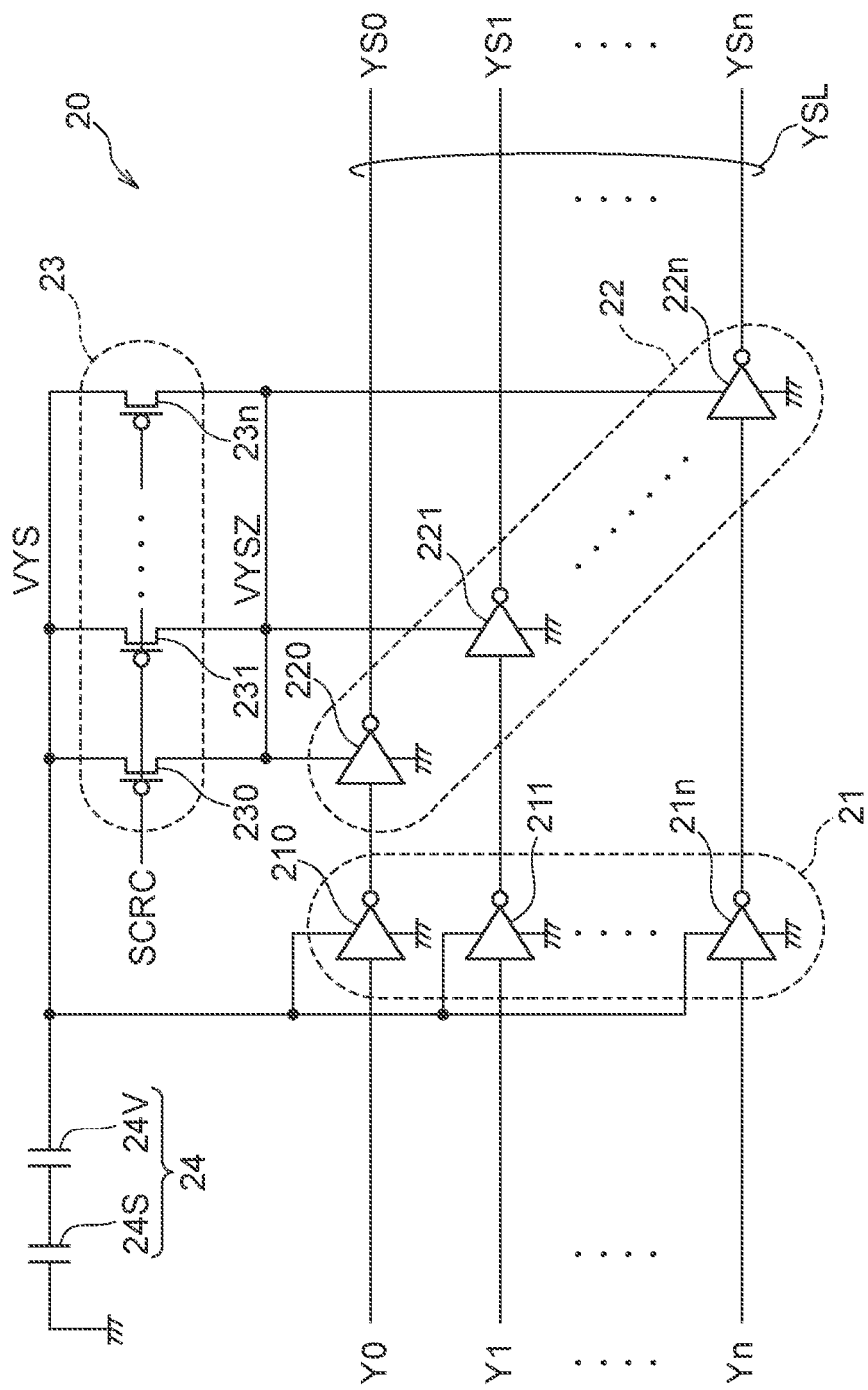
FIG. 2 is a circuit diagram showing a configuration of a main portion of a column decoder according to an embodiment of the disclosure.

FIG. 2 is a circuit diagram showing a configuration of a main portion of a column decoder according to an embodiment of the disclosure. As shown in FIG. 2, the column decoder 20 includes a control circuit 21, a driver circuit 22, a power gating circuit 23, and a compensation capacitance 24. In the example shown in FIG. 2, the control circuit 21 is constituted by (n+1) inverter circuits 210 to 21n. To the inverter circuits 210 to 21n, column selection signals Y0 to Yn are input, respectively, which are obtained by decoding a column address. The control circuit 21 operates with a voltage between a column selection potential VYS and a ground potential VSS. The driver circuit 22 is constituted by (n+1) inverter circuits 220 to 22n. Output signals from the inverter circuits 210 to 21n are input, respectively, to the inverter circuits 220 to 22n. The driver circuit 22 operates with a voltage between a column selection potential VYSZ and the ground potential VSS, so that the inverter circuits 220 to 22n output column selection signals YS0 to YSn, respectively. The column selection signals YS0 to YSn are supplied to the sense amplifier areas 14 shown in FIG. 1 through the column selection lines YSL.

The column selection potential VYSZ is supplied to the driver circuit 22 via the power gating circuit 23. In some embodiments of the disclosure, the power gating circuit 23 is constituted by PMOS transistors 230 to 23n respectively assigned to the inverter circuits 220 to 22n. The column selection potential VYS is supplied to sources of the transistors 230 to 23n in common, and a selection signal SCRC is supplied to gate electrodes of the transistors 230 to 23n in common. Drains of the transistors 230 to 23n are coupled in common to the inverter circuits 220 to 22n that constitute the driver circuit 22. That is, the transistors 230 to 23n constituting the power gating circuit 23 are respectively assigned to the inverter circuits 220 to 22n constituting the driver circuit 22, but the drains of the transistors 230 to 23n are short-circuited to each other. By this configuration, when the selection signal SCRC is activated, the column selection potential VYSZ is supplied to all the inverter circuits 220 to 22n constituting the driver circuit 22 in common. In some embodiments of the disclosure, the transistors 230 to 23n may be NMOS transistors. Any one of the inverter circuits 220 to 22n constituting the driver circuit 22 is activated based on the column selection signals Y0 to Yn. The activated one of the inverter circuits 220 to 22n outputs the column selection potential VYSZ to an associated one of the column selection lines YSL.

Figure 3:
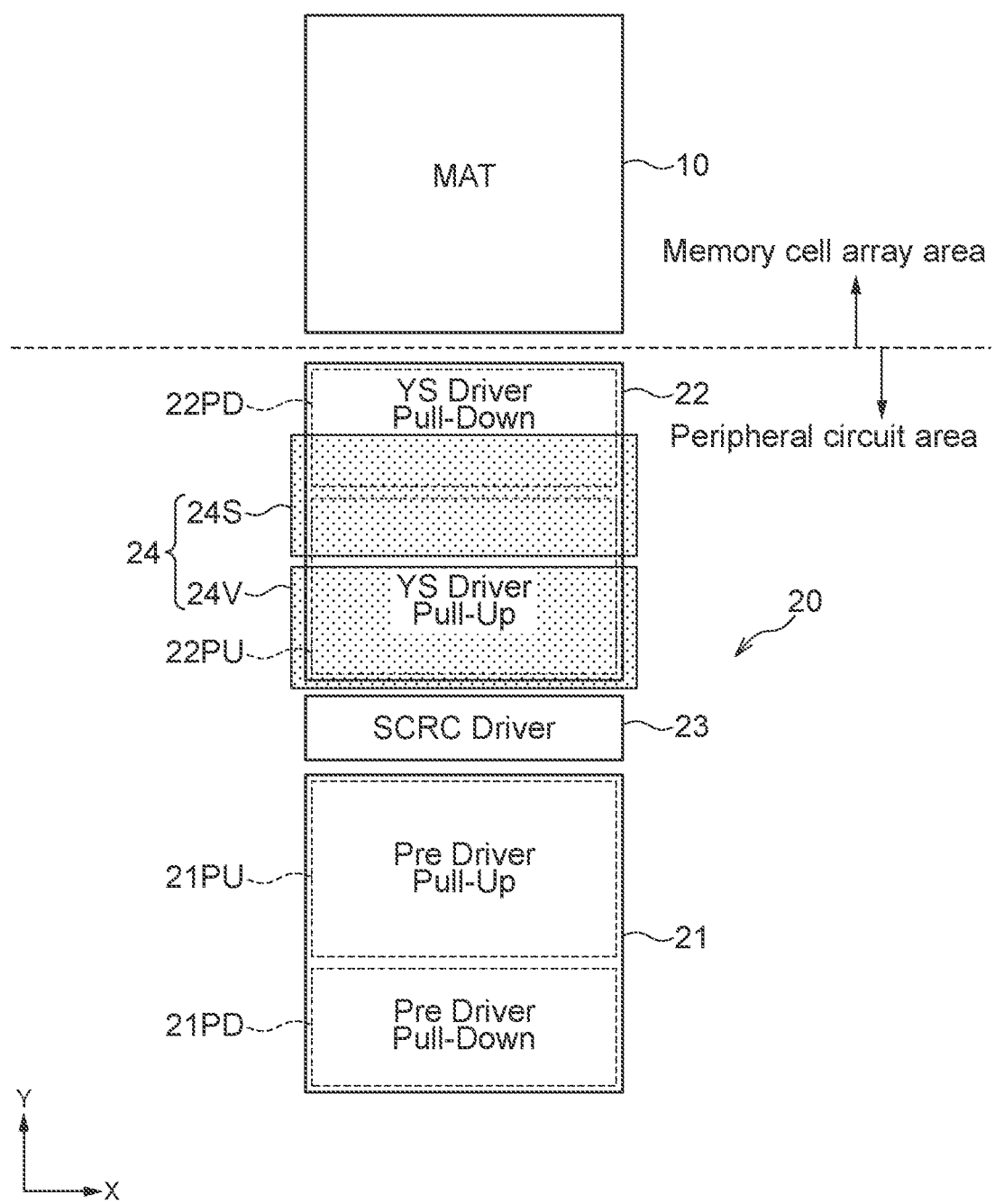
FIG. 3 is a schematic diagram for explaining a first layout of the column decoder according to an embodiment of the disclosure.

FIG. 3 is a schematic diagram for explaining a first layout of a column decoder according to an embodiment of the disclosure. As shown in FIG. 3, the column decoder 20 is laid out in such a manner that the control circuit 21, the power gating circuit 23, and the driver circuit 22 are arranged in the Y direction in this order. That is, the power gating circuit 23 is sandwiched between the control circuit 21 and the driver circuit 22 in the Y direction. The control circuit 21 includes a pull-up area 21PU where pull-up transistors constituting the inverter circuits 210 to 21n are arranged and a pull-down area 21PD where pull-down transistors constituting the inverter circuits 210 to 21n are arranged. For example, the pull-up transistors constituting the inverter circuits 210 to 21n may be PMOS transistors, and the pull-down transistors constituting the inverter circuits 210 to 21n may be NMOS transistors. The power gating circuit 23 is constituted by the PMOS transistors 230 to 23n, for example. As shown in FIG. 3, the pull-up area 21PU and the power gating circuit 23 are laid out to be adjacent to each other in the Y direction. Similarly, the driver circuit 22 includes a pull-up area 22PU where pull-up transistors constituting the inverter circuits 220 to 22n are arranged and a pull-down area 22PD where pull-down transistors constituting the inverter circuits 220 to 22n are arranged. For example, the pull-up transistors constituting the inverter circuits 220 to 22n may be PMOS transistors, and the pull-down transistors constituting the inverter circuits 220 to 22n may be NMOS transistors. As shown in FIG. 3, the pull-up area 22PU and the power gating circuit 23 are laid out to be adjacent to each other in the Y direction. As described above, the pull-up area 21PU, the power gating circuit 23, and the pull-up area 22PU are laid out continuously in the Y direction.

The compensation capacitance 24 is arranged above the driver circuit 22 to overlap on the driver circuit 22. In the first layout, the compensation capacitance 24 is constituted by two compensation capacitances 24V and 24S. The compensation capacitance 24V to which the column selection potential VYS is applied is arranged at a position overlapping on the pull-up area 22PU, and the compensation capacitance 24S to which the ground potential VSS is applied is arranged at a position overlapping on the pull-down area 22PD and the pull-up area 22PU.

Figure 4:
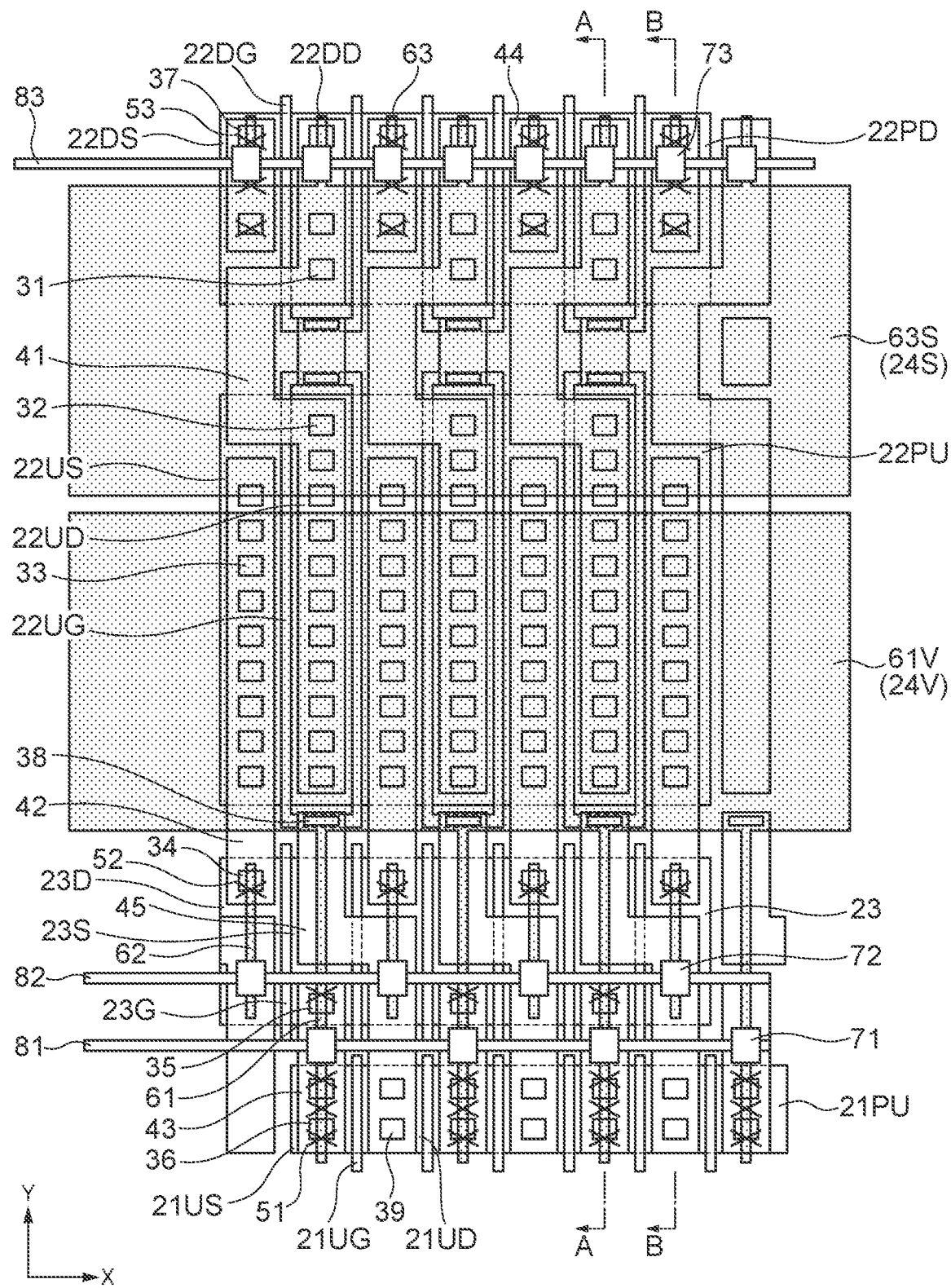
FIG. 4 is a schematic plan view for explaining the first layout of a column decoder according to an embodiment of the disclosure in more detail.
Figure 5A:
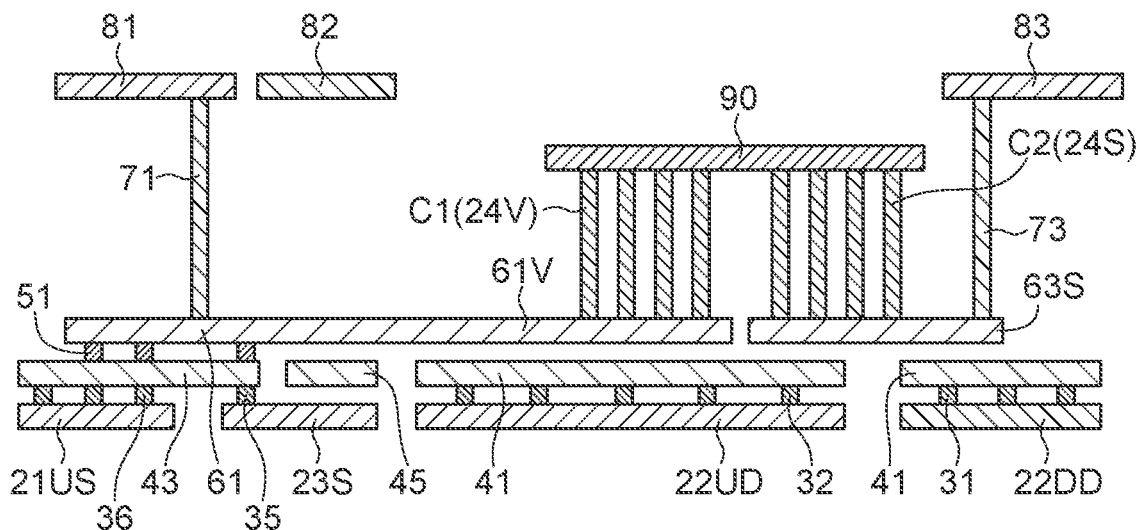
FIG. 5A is a schematic sectional view taken along a line A-A in FIG. 4.
Figure 5B:
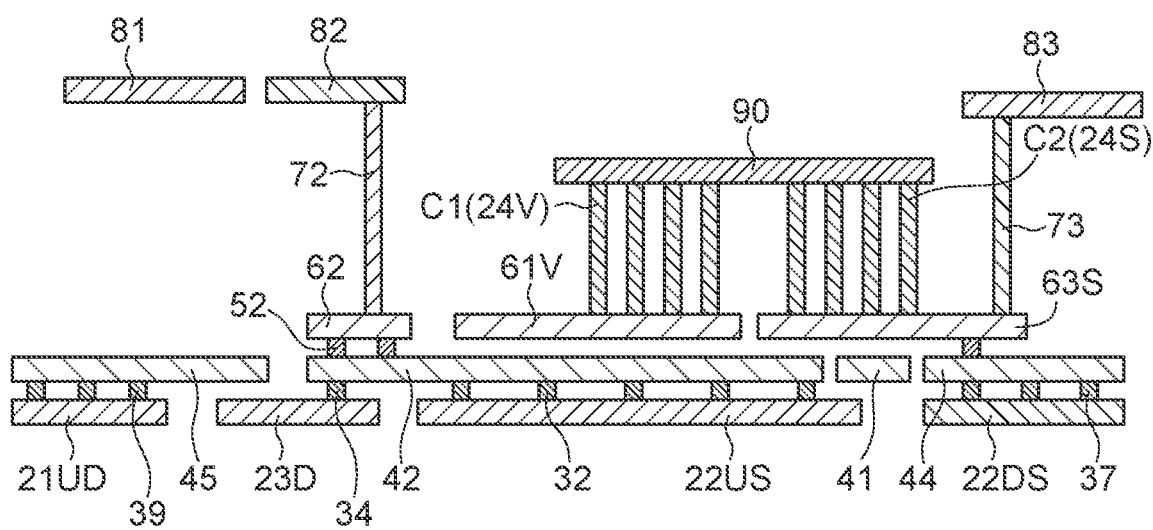
FIG. 5B is a schematic sectional view taken along a line B-B in FIG. 4.

FIG. 4 is a schematic plan view for explaining the first layout of a column decoder according to an embodiment of the disclosure in more detail. FIG. 5A is a schematic sectional view taken along a line A-A in FIG. 4, and FIG. 5B is a schematic sectional view taken along a line B-B in FIG. 4. FIG. 4 shows the power gating circuit 23, the pull-up area 22PU, a portion of the pull-up area 21PU, and a portion of the pull-down area 22PD. In FIG. 4, PMOS transistors are formed in an area where the pull-up areas 21PU and 22PU and the power gating circuit 23 are arranged, and NMOS transistors are formed in the pull-down areas 21PD and 22PD.

Figure 6:
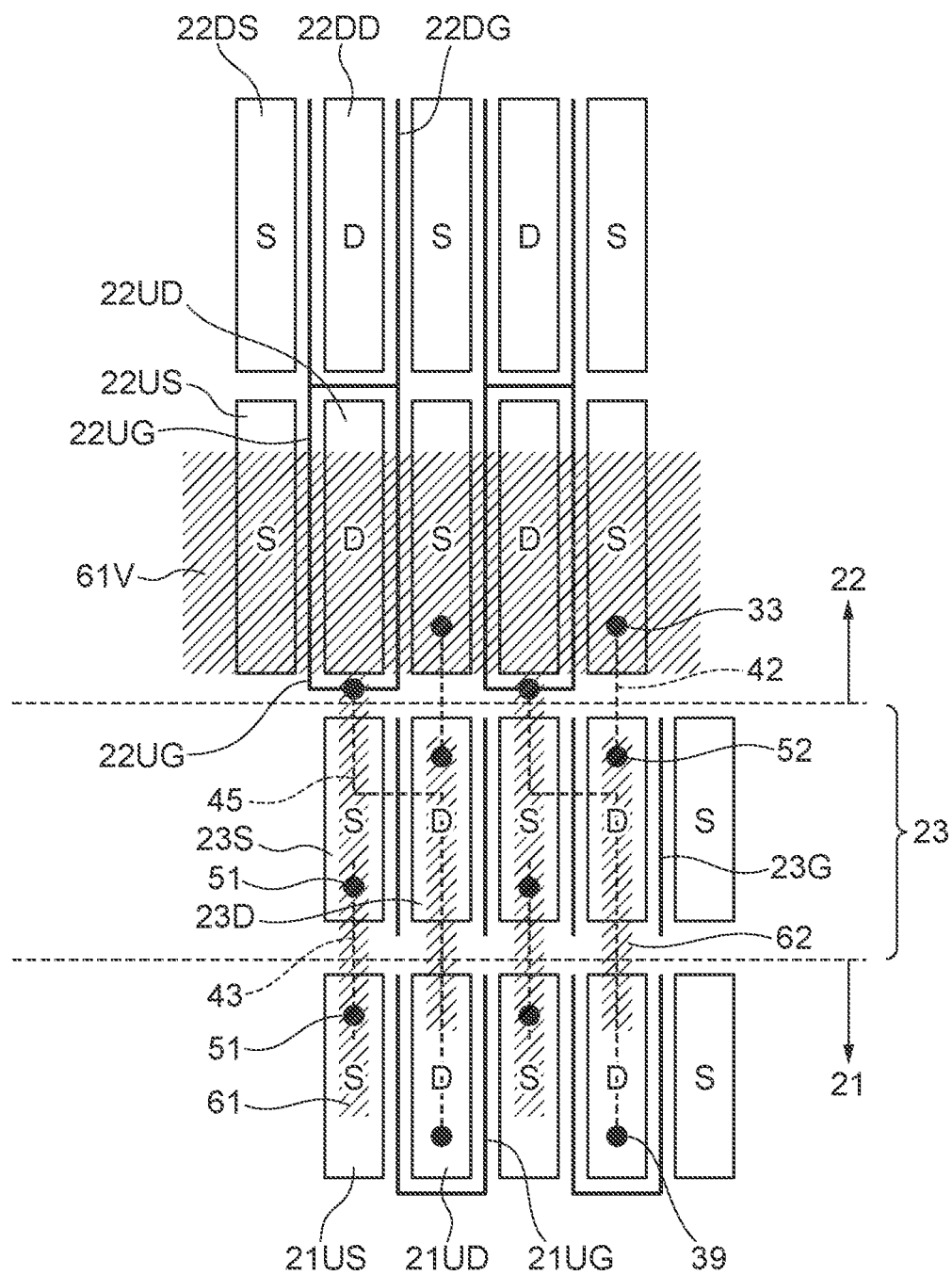
FIG. 6 is a schematic diagram of the plan view shown in FIG. 4.

As shown in FIG. 4, in the pull-down area 22PD, source regions 22DS and drain regions 22DD of the NMOS transistors are alternately arranged in the X direction. In the pull-up area 22PU, source regions 22US and drain regions 22UD of the PMOS transistors are alternately arranged in the X direction. In an area where the power gating circuit 23 is arranged, source regions 23S and drain regions 23D of the PMOS transistors are alternately arranged in the X direction. In the pull-up area 21PU, source regions 21US and drain regions 21UD of the PMOS transistors are alternately arranged in the X direction. In some embodiments of the disclosure, the transistors of the control circuit 21 and the driver circuit 22 are arranged at a same pitch. In plan view, a gate electrode 22DG is arranged between the source region 22DS and the drain region 22DD. In plan view, a gate electrode 22UG is arranged between the source region 22US and the drain region 22UD. In plan view, a gate electrode 23G is arranged between the source region 23S and the drain region 23D. In plan view, a gate electrode 21UG is arranged between the source region 21US and the drain region 21UD. Here, as shown in FIG. 6 that is a schematic diagram of the plan view shown in FIG. 4, the source region 22DS, the source region 22US, the drain region 23D, and the drain region 21UD are arranged in the Y direction, and the drain region 22DD, the drain region 22UD, the source region 23S, and the source region 21US are arranged in the Y direction. Accordingly, the drain region 23D is sandwiched between the corresponding source region 22US and the corresponding drain region 21UD in the Y direction, and the source region 23S is sandwiched between the corresponding drain region 22UD and the corresponding source region 21US in the Y direction.

The drain region 22DD and the drain region 22UD are coupled to a wiring pattern 41 located in a wiring layer M0 via contact conductors 31 and 32, respectively. Accordingly, the drain region 22DD and the drain region 22UD are short-circuited to each other via the wiring pattern 41. The wiring pattern 41 is coupled to a corresponding one of the column selection lines YSL. The source region 22US and the drain region 23D are coupled to a wiring pattern 42 located in the wiring layer M0 via contact conductors 33 and 34, respectively. Accordingly, the source region 22US and the drain region 23D are short-circuited to each other via the wiring pattern 42. The column selection potential VYSZ is supplied to the wiring pattern 42. The source region 23S and the source region 21US are coupled to a wiring pattern 43 located in the wiring layer M0 via contact conductors 35 and 36, respectively. Accordingly, the source region 23S and the source region 21US are short-circuited to each other via the wiring pattern 43. The column selection potential VYS is supplied to the wiring pattern 43. The source region 22DS is coupled to a wiring pattern 44 located in the wiring layer M0 via a contact conductor 37. The ground potential VSS is supplied to the wiring pattern 44. The gate electrodes 22DG and 22UG are coupled to a wiring pattern 45 located in the wiring layer M0 via contact conductors 38, and the drain region 21UD is coupled to the wiring pattern 45 via a contact conductor 39. Accordingly, the gate electrodes 22DG and 22UG and the drain region 21UD are short-circuited to one another via the wiring pattern 45.

The wiring pattern 43 is coupled to a wiring pattern 61 that is located in a wiring layer Li1 and extends in the Y direction, via a contact conductor 51. The wiring pattern 61 is coupled to a solid pattern 61V with a large area on which the compensation capacitance 24V is arranged. Further, the wiring pattern 61 is coupled to a wiring pattern 81 located in a wiring layer M1 via a contact conductor 71. The wiring pattern 81 extends in the X direction. The column selection potential VYS is supplied to the wiring pattern 81. The wiring pattern 42 is coupled to a wiring pattern 62 that is located in the wiring layer Li1 and extends in the Y direction, via a contact conductor 52. The wiring pattern 62 is coupled to a wiring pattern 82 located in the wiring layer M1 via a contact conductor 72. The wiring pattern 82 extends in the X direction. The column selection potential VYSZ is supplied to the wiring pattern 82. The wiring pattern 44 is coupled to a wiring pattern 63 that is located in the wiring layer Li1 and extends in the Y direction, via a contact conductor 53. The wiring pattern 63 is coupled to a solid pattern 63S with a large area on which the compensation capacitance 24S is arranged. Further, the wiring pattern 63 is coupled to a wiring pattern 83 located in the wiring layer M1 via a contact conductor 73. The wiring pattern 83 extends in the X direction. The ground potential VSS is supplied to the wiring pattern 63.

Figure 5C:
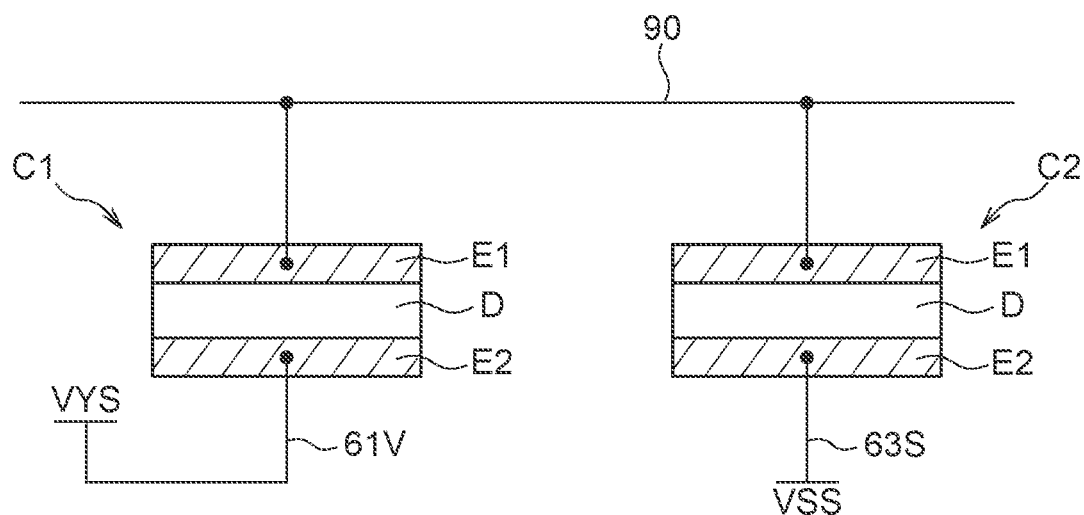
FIG. 5C is a schematic diagram of a cell capacitor according to an embodiment of the disclosure.

As shown in FIGS. 5A and 5B, a plurality of capacitors C1 constituting the compensation capacitance 24V are arranged on the solid pattern 61V, and a plurality of capacitors C2 constituting the compensation capacitance 24S are arranged on the solid pattern 63S. As shown in FIG. 5C, the capacitors C1 and C2 are each constituted by a pair of capacitor electrodes E1 and E2 and a capacitor insulating film D located therebetween according to an embodiment of the disclosure. One of the electrodes of each capacitor C1 is coupled to the solid pattern 61V, and the other electrode thereof is coupled to a plate pattern 90. One of the electrodes of each capacitor C2 is coupled to the solid pattern 63S, and the other electrode thereof is coupled to the plate pattern 90. Accordingly, the capacitors C1 and C2 are coupled in series between the solid pattern 61V to which the column selection potential VYS is supplied and the solid pattern 63S to which the ground potential VSS is supplied. The plate pattern 90 is located between the wiring layer Li1 and the wiring layer M1. The capacitors C1 and C2 have the same structure as a cell capacitor of a DRAM. The wiring layers M0 and Li1 are made of a refractory metal material such as tungsten, and the wiring layer M1 located above the wiring layers M0 and Li1 is made of a low-resistance metal material such as aluminum or copper.

As described above, in the first layout, the compensation capacitances 24V and 24S are arranged above the driver circuit 22, and thus a dedicated space for arranging the compensation capacitances 24V and 24S is not required. In addition, since the power gating circuit 23 is arranged between the driver circuit 22 and the control circuit 21, it is possible to couple the drain region 23D of the power gating circuit 23 and the source region 22US of the driver circuit 22 to each other in the shortest distance by the wiring pattern 42 extending in the Y direction. Further, the wiring patterns 42 arranged in the X direction are coupled, via the wiring pattern 62 having a low resistance, to the wiring pattern 82 having a lower resistance in common. Accordingly, it is possible to supply the column selection potential VYSZ to the source region 22US of the driver circuit 22 with a low resistance without using detouring wiring. Furthermore, since the transistors constituting the driver circuit 22 and the transistors constituting the control circuit 21 and the power gating circuit 23 are shifted from each other in the X direction by half a pitch as shown in FIG. 6, it is possible to lay out the wiring patterns 61 and 62 located in the wiring layer Li1 in a linear manner in the Y direction, so that the flexibility of laying out the wiring layer Li1 can be increased.

Figure 7:
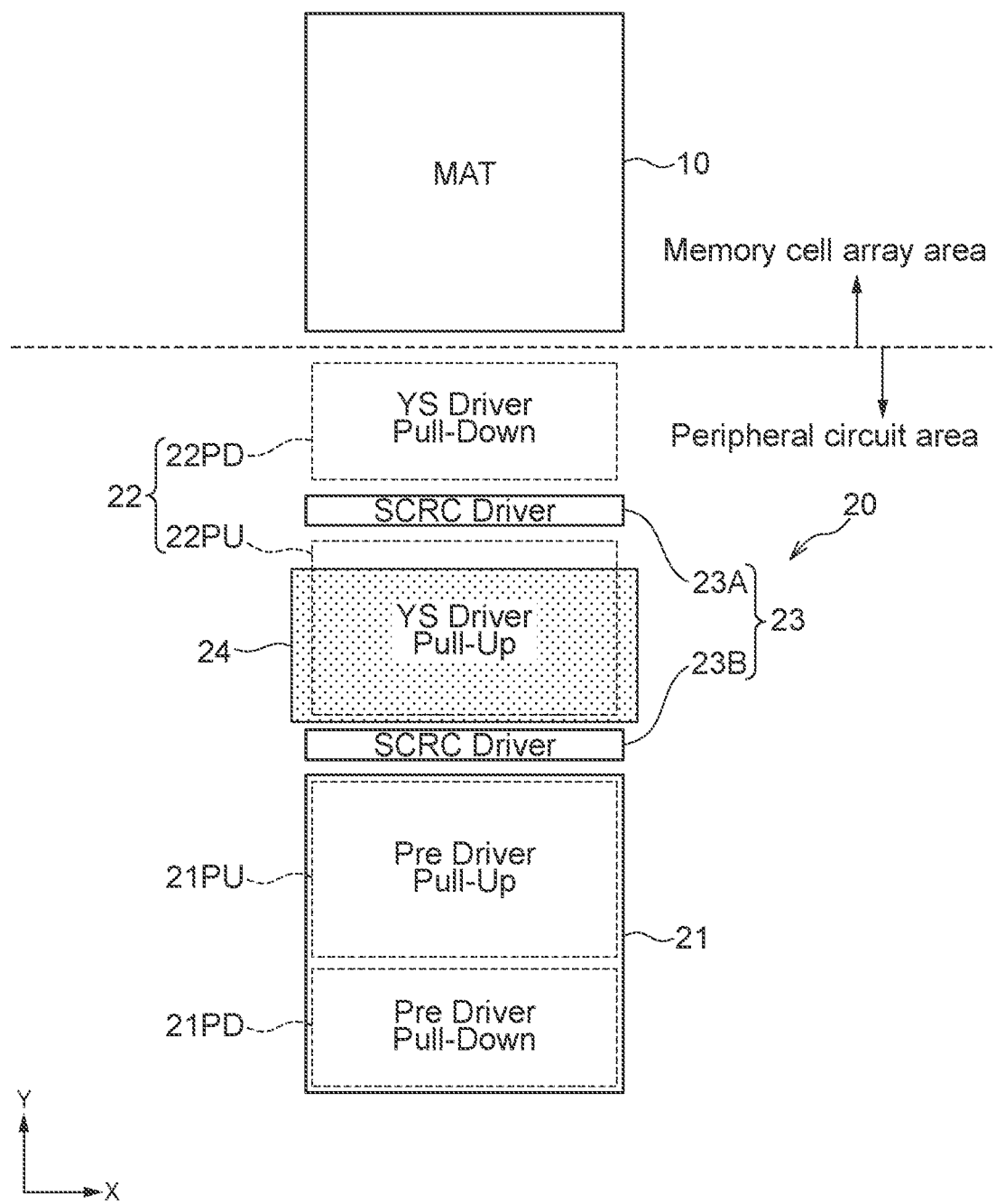
FIG. 7 is a schematic diagram for explaining a second layout of a column decoder according to an embodiment of the disclosure.

FIG. 7 is a schematic diagram for explaining a second layout of a column decoder according to an embodiment of the disclosure. In the example shown in FIG. 7, the power gating circuit 23 is divided into two power gating circuits 23A and 23B, and the pull-up area 22PU of the driver circuit 22 is sandwiched between the two power gating circuits 23A and 23B in the Y direction. The compensation capacitance 24 is arranged above the pull-up area 22PU of the driver circuit 22.

Figure 8:
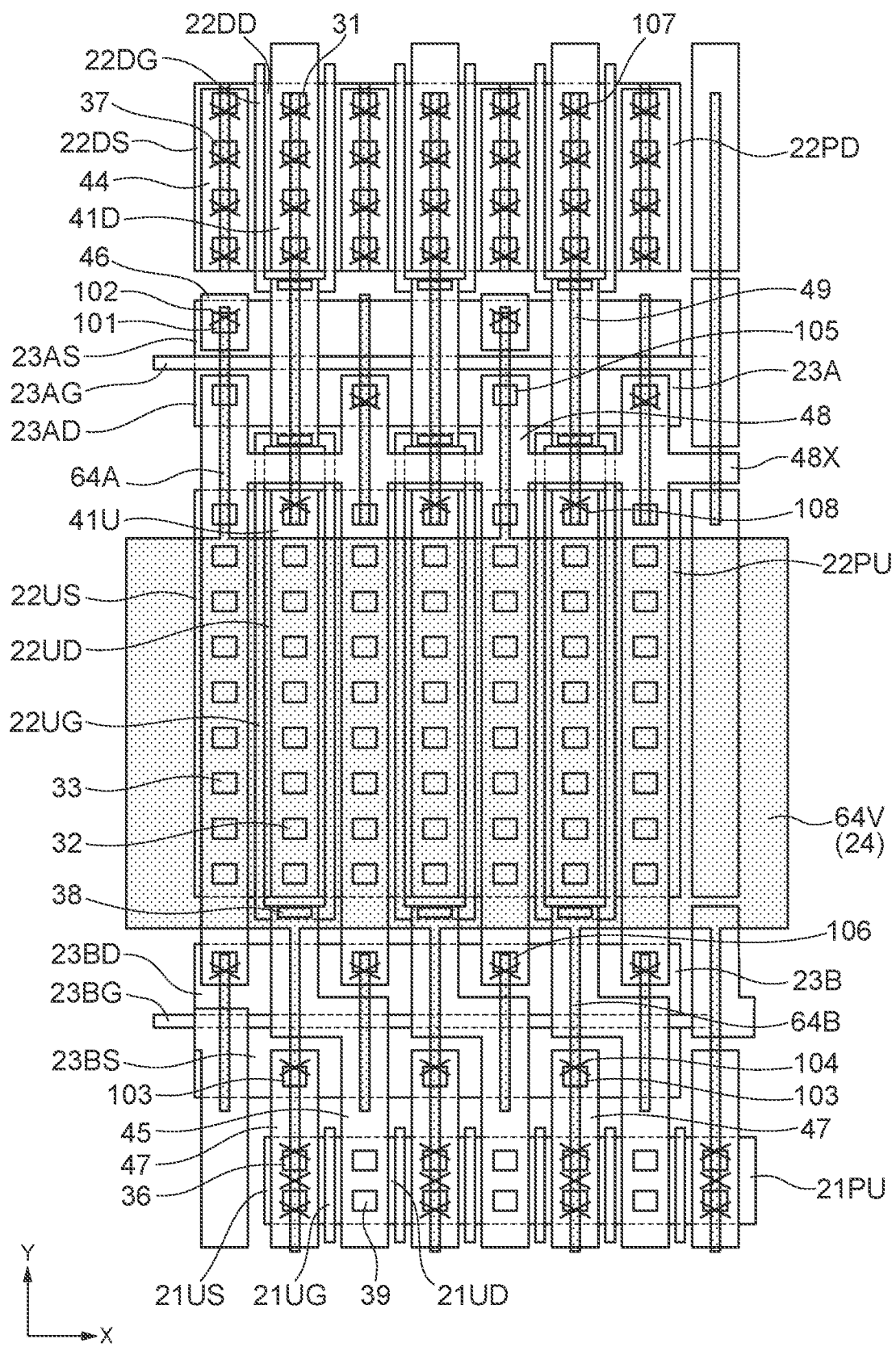
FIG. 8 is a schematic plan view for explaining the second layout of a column decoder according to an embodiment of the disclosure in more detail.

FIG. 8 is a schematic plan view for explaining the second layout of a column decoder according to an embodiment of the disclosure in more detail. As shown in FIG. 8, in the second layout of a column decoder, a source region 23AS and a drain region 23AD of the power gating circuit 23A are arranged in the Y direction, and a source region 23BS and a drain region 23BD of the power gating circuit 23B are arranged in the Y direction. In association with this arrangement, gate electrodes 23AG and 23BG extend in the X direction. The source region 23AS is coupled to a wiring pattern 64A that is located in the wiring layer Li1 and extends in the Y direction, via a contact conductor 101, a wiring pattern 46, and a contact conductor 102. The source region 23BS is coupled to a wiring pattern 64B that is located in the wiring layer Li1 and extends in the Y direction, via a contact conductor 103, a wiring pattern 47, and a contact conductor 104. The wiring patterns MA and MB are coupled to a solid pattern 64V with a large area on which the compensation capacitance 24 is arranged. The column selection potential VYS is supplied to the wiring pattern 64V. The drain regions 23AD and 23BD are coupled to a wiring pattern 48 that is located in the wiring layer M0 and extends in the Y direction, via contact conductors 105 and 106, respectively. The wiring patterns 48 adjacent to each other in the X direction are short-circuited to each other via a coupling portion 48X extending in the X direction. Further, the wiring pattern 41 is divided into a wiring pattern 41D located above the drain region 22DD and a wiring pattern 41U located above the drain region 22UD, and both the patterns are coupled to a wiring pattern 49 that is located in the wiring layer Li1 and extends in the Y direction via contact conductors 107 and 108, respectively.

Figure 9A:
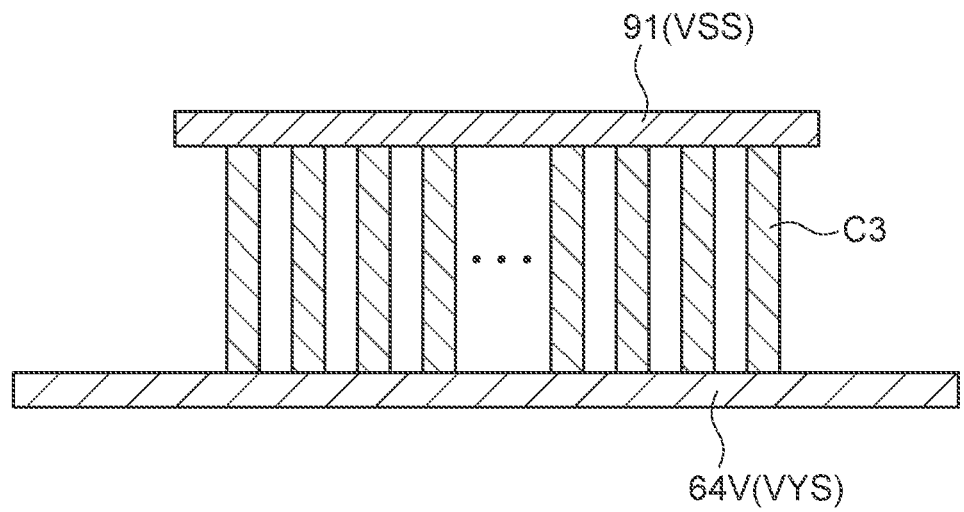
FIG. 9A is a schematic sectional view of a capacitor C3 according to an embodiment of the disclosure.
Figure 9B:
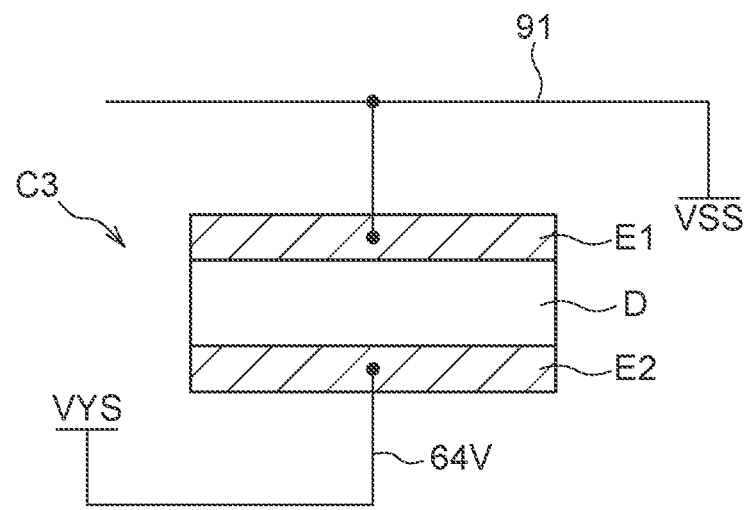
FIG. 9B is a schematic diagram of the cell capacitor according to an embodiment of the disclosure.

As shown in FIG. 9A, a plurality of capacitors C3 constituting the compensation capacitance 24 are arranged on the solid pattern 64V according to an embodiment of the disclosure. As shown in FIG. 9B, the capacitors C3 are each constituted by a pair of capacitor electrodes E1 and E2 and a capacitor insulating film D located therebetween. One of the electrodes of each capacitor C3 is coupled to the solid pattern 64V, and the other electrode thereof is coupled to a plate pattern 91 to which the ground potential VSS is supplied. Accordingly, the capacitors C3 are coupled between the solid pattern 64V to which the column selection potential VYS is supplied and the plate pattern 91 to which the ground potential VSS is supplied.

As described above, when the two power gating circuits 23A and 23B are arranged to sandwich the pull-up area 22PU of the driver circuit 22 therebetween in the Y direction, the column selection potential VYSZ is supplied to the driver circuit 22 from both sides in the Y direction. Therefore, it is possible to supply the column selection potential VYSZ to the source region 22US of the driver circuit 22 with a lower resistance.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

The invention claimed is:

1. An apparatus comprising:
   a driver circuit including a plurality of first transistors arranged in a first direction;
   a control circuit including a plurality of second transistors arranged in parallel to the plurality of first transistors, each of the plurality of second transistors being coupled to control an associated one of the first transistors; and
   a power gating circuit arranged between the driver circuit and the control circuit, the power gating circuit being configured to supply a first power potential to each of the plurality of first transistors,
   wherein the driver circuit, the power gating circuit, and the control circuit are arranged in a second direction perpendicular to the first direction.

2. The apparatus of claim 1, wherein the control circuit is configured to control the driver circuit such that a selected one of the plurality of first transistors outputs an output signal in an active state.

3. The apparatus of claim 1, wherein a position of each of the second transistors in the first direction is shifted from a position of an associated one of the first transistors in the first direction.

4. The apparatus of claim 3,
   wherein the first and second transistors are arranged at a first pitch in the first direction, and
   wherein the position of each of the second transistors in the first direction is different by half of the first pitch from the position of an associated one of the first transistors in the first direction.

5. The apparatus of claim 1, further comprising a power supply line extending in the first direction,
   wherein the power gating circuit includes a plurality of third transistors each coupled to the power supply line to receive a second power potential and provide the first power potential responsive to the second power potential.

6. The apparatus of claim 4, wherein the third transistors are arranged in the first direction.

7. The apparatus of claim 5, further comprising a compensation capacitor supplied with the second power potential,
   wherein at least a part of the compensation capacitor is above the driver circuit.

8. An apparatus comprising:
   a driver circuit including a plurality of first transistors arranged in a first direction;
   a control circuit including a plurality of second transistors arranged in parallel to the plurality of first transistors, each of the plurality of second transistors being coupled to control an associated one of the first transistors; and
   a power supply line extending in the first direction;
   a power gating circuit arranged between the driver circuit and the control circuit, the power gating circuit being configured to supply a first power potential to each of the plurality of first transistors, wherein the power gating circuit includes a plurality of third transistors each coupled to the power supply line to receive a second power potential and provide the first power potential responsive to the second power potential;
   a compensation capacitor supplied with the second power potential, wherein at least a part of the compensation capacitor is above the driver circuit; and
   a first conductive layer including a first wiring pattern,
   wherein the compensation capacitor having a first electrode supplied with the second power potential, and
   wherein the first wiring pattern is coupled in common to sources of the second transistors, sources of the third transistors, and the first electrode.

9. The apparatus of claim 8,
   wherein the first conductive layer further includes a second wiring pattern supplied with the first power potential, and
   wherein the second wiring pattern is coupled in common to a source of one of the first transistors and a drain of one of the second transistors.

10. The apparatus of claim 9, wherein the first and second wiring patterns are extending in the second direction in parallel.

11. An apparatus comprising:
    a driver circuit including a plurality of first transistors arranged in a first direction;
    a control circuit including a plurality of second transistors arranged in parallel to the plurality of first transistors, each of the plurality of second transistors being coupled to control an associated one of the first transistors;
    a power supply line extending in the first direction,
    a power gating circuit arranged between the driver circuit and the control circuit, the power gating circuit being configured to supply a first power potential to each of the plurality of first transistors, wherein the power gating circuit includes a plurality of third transistors each coupled to the power supply line to receive a second power potential and provide the first power potential responsive to the second power potential; and
    another power gating circuit configured to supply the first power potential to each of the plurality of first transistors,
    wherein the driver circuit is arranged between the power gating circuit and the other power gating circuit.

12. The apparatus of claim 11,
    wherein each of the power gating circuit and the other power gating circuit includes a third transistor coupled in parallel between the power supply line and the plurality of first transistors, and
    wherein a gate electrode of the third transistor extends in the first direction.

13. An apparatus comprising:
    a first transistor area including a plurality of first source regions and a plurality of first drain regions alternately arranged in a first direction;
    a second transistor area including a plurality of second source regions and a plurality of second drain regions alternately arranged in the first direction; and
    a third transistor area including a plurality of third source regions and a plurality of third drain regions alternately arranged in the first direction,
    wherein the third transistor area is arranged between the first and second transistor areas in a second direction,
    wherein each of the third source regions is located between an associated one of the first drain regions and an associated one of the second source regions in the second direction, wherein each of the third drain regions is located between an associated one of the first source regions and an associated one of the second drain regions in the second direction, wherein each of the first source regions is short-circuited to an associated one of the third drain regions via a first wiring pattern extending in the second direction, and wherein each of the second source regions is short-circuited to an associated one of the third source regions via a second wiring pattern extending in the second direction.

14. The apparatus of claim 13, wherein the third source regions are short-circuited to one another via a third wiring pattern extending in the first direction, and wherein the third drain regions are short-circuited to one another via a fourth wiring pattern extending in the first direction.

15. The apparatus of claim 14, wherein the first and second wiring patterns are formed on a first conductive layer, and wherein the third and fourth wiring patterns are formed on a second conductive layer located above the first conductive layer.

16. The apparatus of claim 14, wherein the first transistor area further includes a plurality of gate electrodes arranged in the first direction, and wherein each of the gate electrodes is short-circuited to an associated one of the second drain regions via a fifth wiring pattern.

17. The apparatus of claim 16, wherein the fifth wiring pattern is formed on the first conductive layer.

18. An apparatus comprising:

a first transistor area including a plurality of first transistors having a first conductivity type;

a second transistor area including a plurality of second transistors having the first conductivity type; and a third transistor area including a plurality of third transistors having the first conductivity type, wherein the third transistor area is arranged between the first and second transistor areas in a second direction, wherein a gate electrode of each of the first transistors is short-circuited to an associated one of a drain region of each of the second transistors, wherein source electrodes of the first transistors are short-circuited in common to drain regions of the third transistors, and wherein source electrodes of the second transistors are short-circuited in common to source regions of the third transistors.

19. The apparatus of claim 18, wherein the source regions of the first transistors, the drain regions of the third transistors, and the drain regions of the second transistors are aligned in the second direction, and wherein drain regions of the first transistors, the source regions of the third transistors, and the source regions of the second transistors are aligned in the second direction.

* * * * *